US005551572A

United States Patent [19]

Nemoto

[11] Patent Number: 5,551,572
[45] Date of Patent: Sep. 3, 1996

[54] TRAY FOR SEMICONDUCTOR DEVICES

[75] Inventor: Hisashi Nemoto, Tokyo, Japan

[73] Assignee: Shinon Denkisangyo Kabushiki-Kaisha, Tokyo, Japan

[21] Appl. No.: 376,879

[22] Filed: Jan. 23, 1995

[30] Foreign Application Priority Data

Sep. 7, 1994 [JP] Japan .................... 6-239502

[51] Int. Cl.⁶ .................................. B65D 73/02
[52] U.S. Cl. .................. 206/725; 206/726; 206/728; 206/563
[58] Field of Search ................ 206/725, 726, 206/728, 722, 718, 562, 563, 565

[56] References Cited

U.S. PATENT DOCUMENTS

| | | | |
|---|---|---|---|
| 3,615,006 | 10/1971 | Freed | 206/454 |
| 3,892,312 | 7/1975 | Tems | 206/724 |
| 4,448,306 | 5/1984 | Sinnadurai et al. | 206/725 |
| 4,556,145 | 12/1985 | Putman | 206/724 |
| 4,671,407 | 6/1987 | Brutosky | 206/718 |
| 4,718,548 | 1/1988 | Estrada et al. | 206/724 |
| 4,881,639 | 11/1989 | Matsuoka et al. | 206/724 |
| 5,080,228 | 1/1992 | Maston, III et al. | 206/719 |
| 5,103,976 | 4/1992 | Murphy | 206/725 X |
| 5,263,583 | 11/1993 | Ohashi | 206/725 X |
| 5,305,879 | 4/1994 | Noschese | 206/718 |
| 5,310,076 | 5/1994 | Burton et al. | 206/725 X |
| 5,318,181 | 6/1994 | Stover et al. | 206/459.1 |
| 5,335,771 | 8/1994 | Murphy | 206/725 |
| 5,400,904 | 3/1995 | Maston, III et al. | 206/725 |
| 5,418,692 | 5/1995 | Nemoto | 206/725 X |
| 5,481,438 | 1/1996 | Nemoto | 206/725 X |

Primary Examiner—Paul T. Sewell
Assistant Examiner—Tara Laster
Attorney, Agent, or Firm—Frishauf, Holtz, Goodman, Langer & Chick

[57] ABSTRACT

A tray for housing semiconductor devices of a ball grid type, each having a surface provided with a plurality of wiring solder balls, the surface of each of the semiconductor devices having peripheral edges, and each of the wiring solder balls having a diameter, includes a tray surface, and pockets formed in the tray surface, each pocket having corners and a shape similar to and slightly larger than the surface of each semiconductor device. Each pocket has a bottom surface forming a depression and having a shape similar to and slightly smaller than the surface of each of the semiconductor devices and a depth larger than the diameter of each wiring solder ball. Each of ribs has a root formed on each corner of each pocket for dividing the pockets from each other and each having a width gradually increasing toward the bottom surface of each pocket. Supporting step portion is formed between the roots of the ribs and the depressions for supporting corresponding ones of the peripheral edges of the surface of each semiconductor device. Each supporting step portion has an inner wall constituting an inner wall of the depression. Projections are formed in the inner wall of the depression for receiving the solder balls which are disposed outermost of the wiring solder balls.

3 Claims, 5 Drawing Sheets

5,551,572

TRAY FOR SEMICONDUCTOR DEVICES

BACKGROUND OF THE INVENTION

1. Field of the Invention

The present invention relates to a tray for housing semiconducutor devices and more particularly to a tray for housing semiconductor devices of a ball grid array type provided with wiring solder balls on the undersurfaces of the semiconductor devices.

2. Description of the Prior Art

One of the semiconductor devices is of a ball grid array type provided on its undersurfaces with many solder balls made of substantially hemispherical solder material as wiring terminals. The semiconductor devices of this type are placed on a substrate, and solder balls are soldered to a substrate circuit by heating means such as a heater after the device is placed on a circuit substrate. In this way, the semiconductor devices are mounted on the substrate.

In FIG. 9 is shown a conventional tray 21 for housing semiconductor devices 23 of a ball grid type. Each semiconductor device 23 is housed in the corresponding pocket 22 formed in the upper surface of the tray 21 in a state in which solder balls 24 provided on the undersurface of the device 23 are in contact with the bottom surface of the pocket 22. The tray 21 is covered with another tray so that vertical movement of the device 23 in the lower tray 21 is restricted by downward extending ribs 25 formed on the undersurface of the upper tray 21.

A tray for housing semiconductor devices of a general type is made of a synthetic resin material mixed with antistatic carbon black. Since the solder balls are housed in the conventional semiconductor device of a ball grid array type in a state in which they are in contact with the tray, fine powder of carbon black in this synthetic resin is attached to the solder balls, causing disconnection between the solder balls and the substrate circuit upon assembly of the semiconductor device. In consequence, such a tray must be made of a special type of a synthetic resin material mixed with carbon black from which fine powder is not produced. This increases the manufacturing cost of the tray.

SUMMARY OF THE INVENTION

The object of the present invention is to provide a tray for housing semiconductor devices without contacting solder balls with the tray whereby the tray can be made of an inexpensive material to reduce the manufacturing cost of the tray.

In order to achieve the object of the present invention, a tray for housing semiconductor devices of a ball grid type each having a surface provided with a plurality of wiring solder balls, the surface of each of the semiconductor devices having peripheral edges, each of the wiring solder balls having a diameter, comprises a tray surface; a plurality of pockets formed in the tray surface and each having corners and a shape similar to and slightly larger than the surface of each of the semiconductor devices, each of the pockets having a bottom surface forming a depression and having a shape similar to and slightly smaller than the surface of each of the semiconductor devices and a depth larger than the diameter of each of the wiring solder balls; ribs each having a root formed on each of the corners of each of the pockets for dividing the pockets from each other and each having a width gradually increasing toward the bottom surface of each of the pockets; supporting step portions each formed between the root of the rib and the depression for supporting corresponding ones of the peripheral edges of the surface of each of the semiconductor devices, each of the supporting step portions having an inner wall constituting an inner wall of the depression; and projections formed in the inner wall of the depression for receiving the solder balls which are disposed outermost of the wiring solder balls.

DESCRIPTION OF THE PREFERRED EMBODIMENTS

Figure 1:
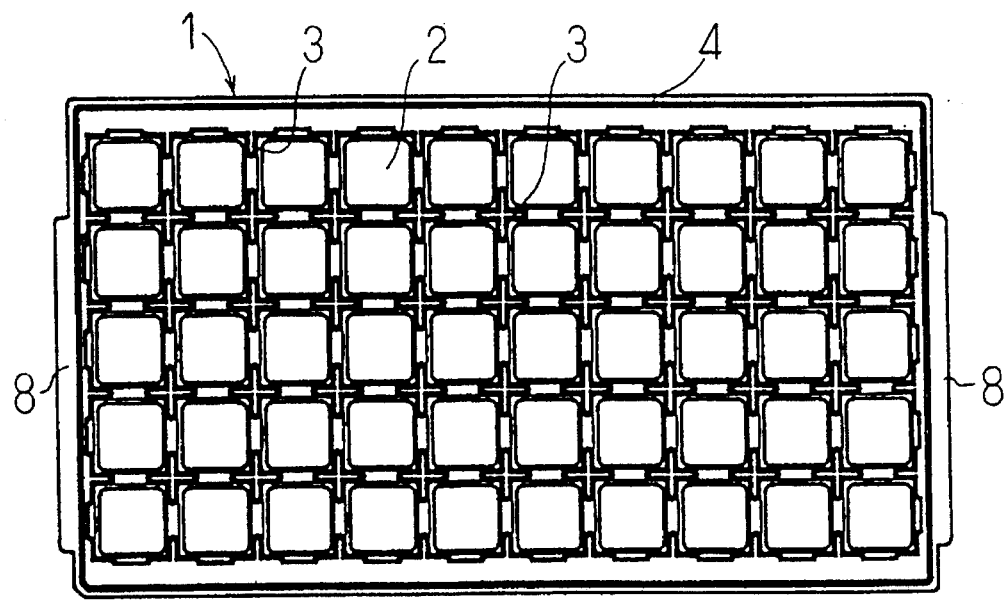
FIG. 1 is a plan view of a tray for semiconductor devices according to an embodiment of the present invention.
Figure 2:
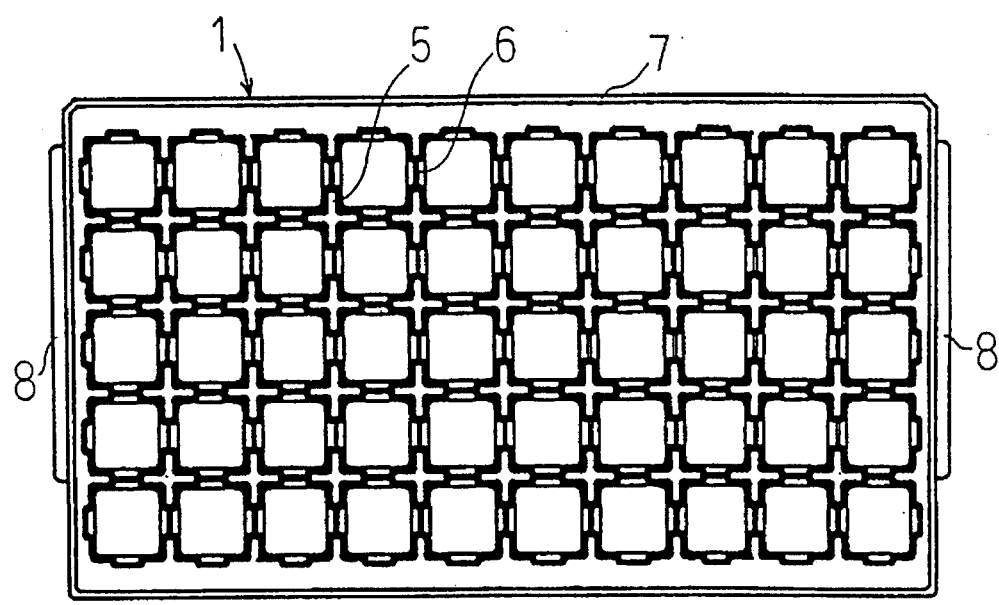
FIG. 2 is a bottom view of the tray of FIG. 1.

A preferred embodiment of a tray for semiconductor devices according to the present invention will be described in detail with reference to FIGS. 1 to 7.

In use, a plurality of trays according to the present invention house semiconductor devices of a ball grid type and are piled up. The upper surface of each tray functions as a container and its undersurface functions as a lid.

A plurality of pockets 2 for housing semiconductor devices are formed in the upper surface of the tray 1. On the four corners of each pocket 2 are formed upward extending ribs 3 tapered so as to be widened downward and divide the pocket 2 from the pockets adjacent thereto. Upward extending side frames 4 are formed on the edges of the upper surface of the tray 1.

The upward extending ribs 3 do not constitute a continuous lattice but are formed only on the four corners of each pocket 2 so that the four sides of each pocket 2 between the adjacent ribs 3 are opened. This arrangement allows sides of the semiconductor device in the pocket to be held easily.

Downward extending ribs 5 are formed at the positions in the undersurface of the tray 1 which correspond to the positions of the upward extending ribs 3 on the upper surface of the tray 1. Projections 6 are formed between adjacent longitudinally and crosswise arranged downward extending ribs 5. When the trays 1 are piled up, the side frames 7 of the upper trays 1 are fitted on the outer faces of the side frames 4 of the lower trays 1, and the projections 6 are inserted in the spaces between the upward extending ribs 3 of the lower trays 1.

Grips 8 for holding the tray 1 in order to carry it are formed on the longitudinal end sides of the tray 1.

Figure 3:
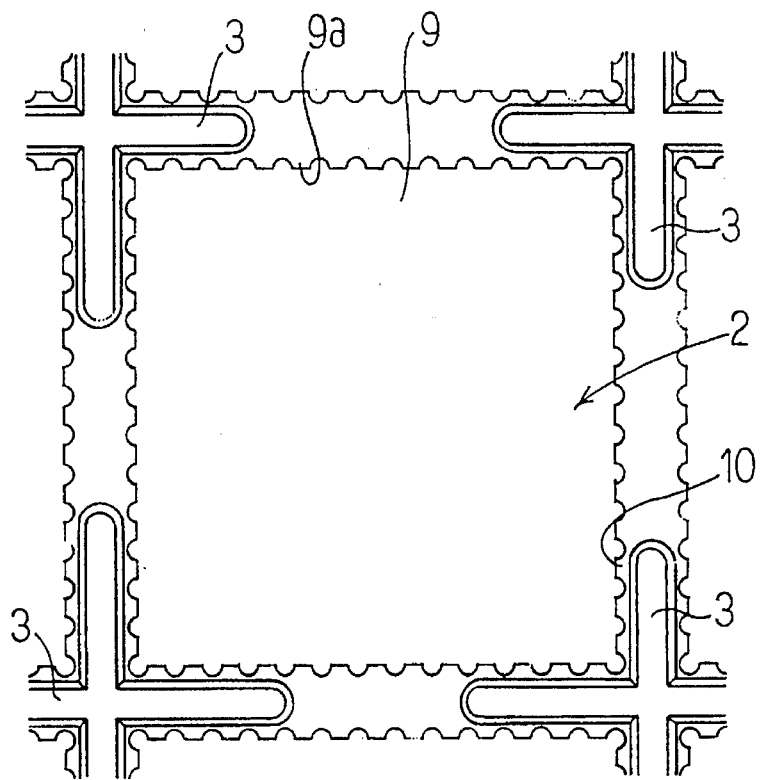
FIG. 3 is an enlarged plan view of a pocket of the tray of FIG. 1.
Figure 4:
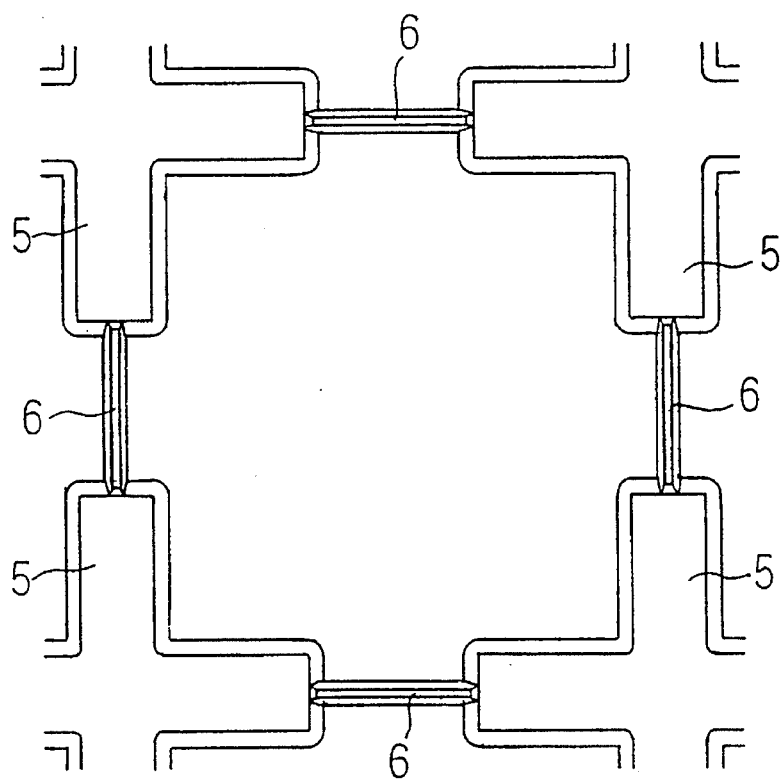
FIG. 4 is a bottom view of the pocket of FIG. 3.
Figure 5:
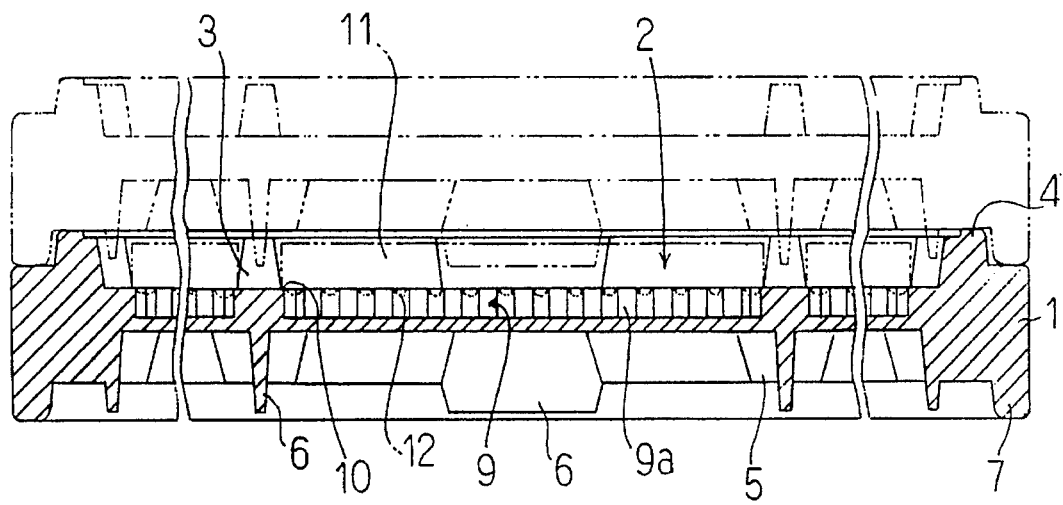
FIG. 5 is an enlarged longitudinal cross-sectional view of the tray of FIG. 1.
Figure 6:
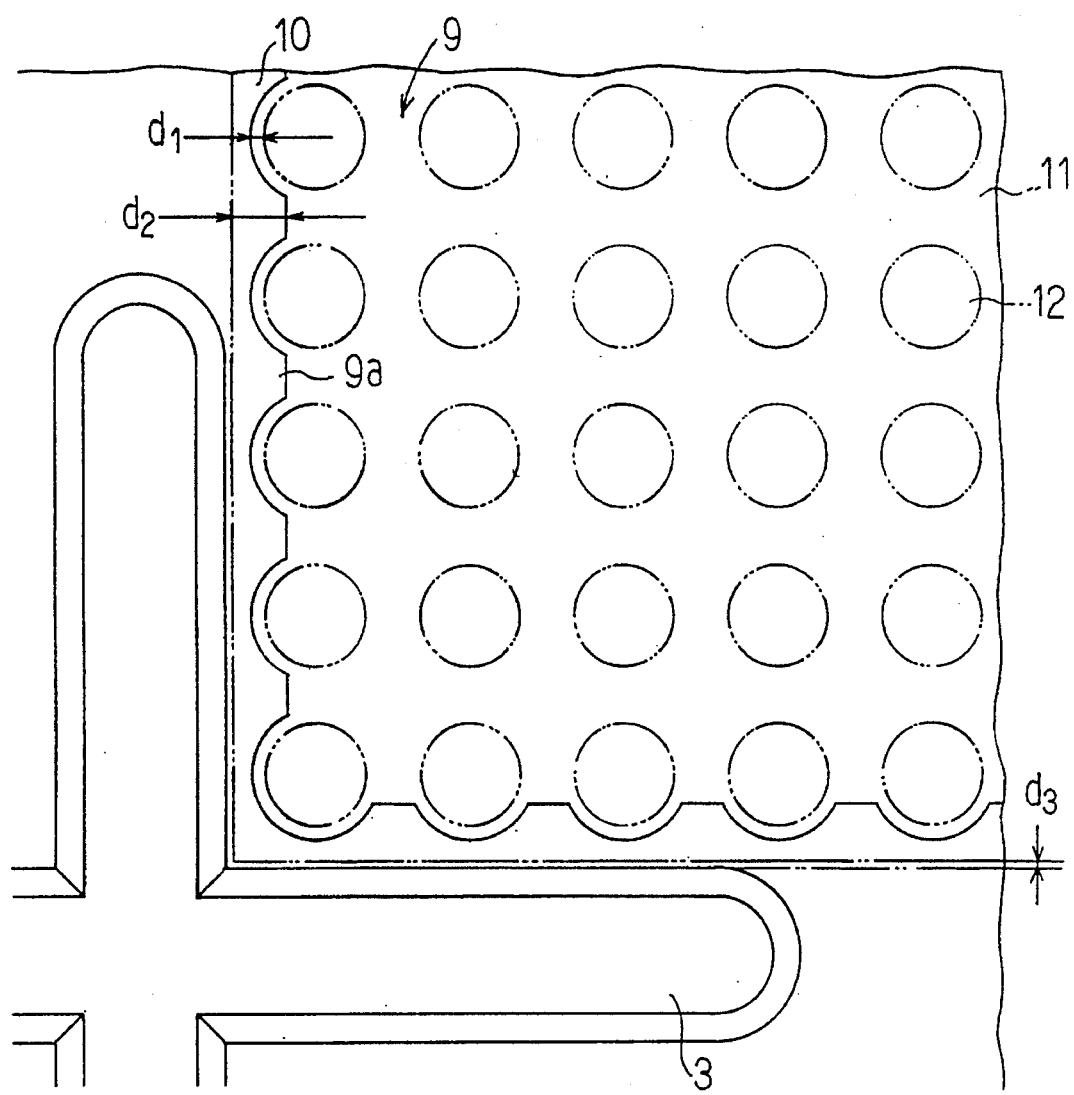
FIG. 6 is an enlarged plan view of a supporting step portion of the tray of FIG. 5.

FIGS. 3 and 4 are an enlarged plan view and an enlarged bottom view of the pocket 2, respectively.

In the central portion of each pocket 2 divided at its four corners by the upward extending ribs 3 from the adjacent pockets 2 is formed a depression 9 having a plan shape similar to and slightly smaller than the undersurface of the corresponding semiconductor device. Supporting step portions 10 for supporting the outer peripheral edges of the undersurface of the semiconductor device are formed between the depression 9 and the roots of the upward extending ribs 3.

In order to house the semiconductor devices in the trays without contacting the solder balls with the trays in the conventional case, the outer peripheral edge portions of the undersurface of each semiconductor device which are at the outer sides of the solder balls may be supported. Since, however, the gaps between the outer peripheral edge portions of the undersurface of the semiconductor device and the solder balls which face them are only the order of 0.15 mm and the dimensional tolerances of the semiconductor devices and the trays are not much smaller than this value, it was impossible to support the semiconductor device without contacting the solder balls with the trays, even if supporting step portions having a width of this order are provided.

In the tray according to the present invention, projecting portions 9a extending from their bottom to their top are formed in the inner peripheral walls of each depression 9. The parts of the supporting step portions 10 at the top ends of the projecting portions 9a enter the spaces defined by adjacent solder balls which face the supporting step portions 10 so as to support the undersurfaces of the semiconductor devices. As shown in a large scale in FIG. 6, each of the parts of the supporting step portions 10 between the adjacent projecting portions 9a has a semicircularly depressed shape following the shape of the outer portion of the corresponding solder ball 12. In this arrangement, the distance d1 between each of the semicircularly depressed portions of the supporting step portion 10 and the corresponding solder ball 12 is set to 0.100 mm, for example, the maximum width d2 of the supporting step portion 10, to 0.30 to 0.35 mm, for example, and the distance d3 between the outer peripheral edges of the undersurface of the semiconductor device and the roots of the corresponding upward extending ribs 3, to 0.05 mm, for example.

Since the distance d1 between the supporting step portion 10 and the solder balls 12 is larger than the distance d3 between the outer peripheral edges of the undersurface of the semiconductor device 11 and the root of the upward extending rib 3, the horizontal movements of the semiconductor device 11 are restricted by the roots of the upward extending ribs 3. Even if, therefore, the semiconductor device 11 is displaced horizontally in the pocket 2, the outer peripheral edge of the undersurface of the semiconductor device 11 contacts the root of the upward extending rib 3. Thus, the solder balls 12 do not contact the inner walls of the depression 9.

Figure 8:
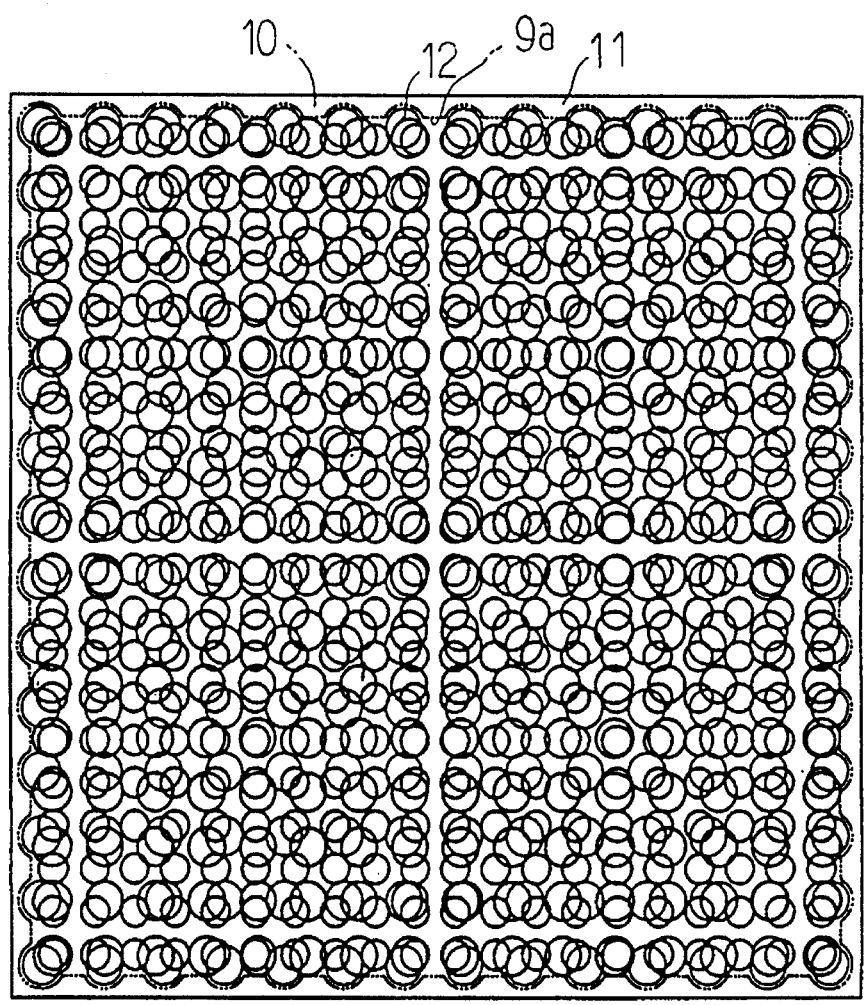
FIG. 8 is a plan view showing overlapped arrangement patterns of solder balls of the semiconductor devices.
Figure 9:
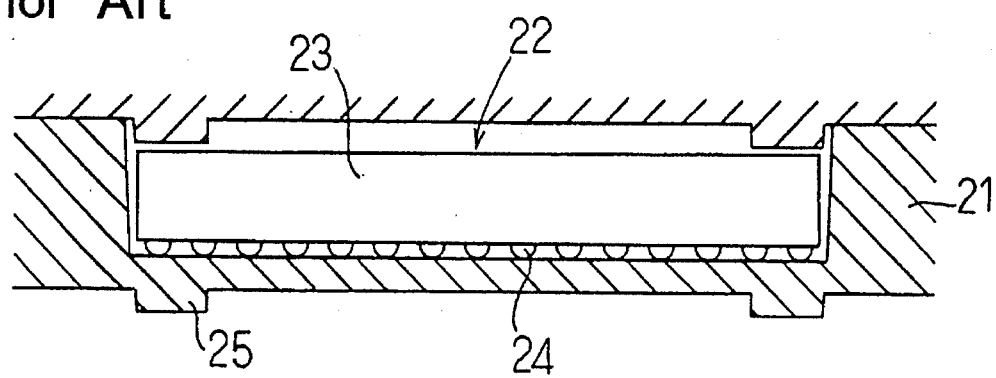
FIG. 9 is a longitudinal cross-sectional view of a conventional tray for semiconductor devices of a ball grid array type.

In a case where the number and/or the dimensions of solder balls, and/or the distances between the solder balls are different although the semiconductor devices of a ball grid array type have the same size, the semiconductor devices having different arrangements of the solder balls can be housed in the same tray, by overlapping the different arrangement patterns of the solder balls on one after another as shown in FIG. 8 and determining the dimensions of the projecting portions 9a in the inner walls of the depression 9 and the distances between the adjacent projecting portions 9a.

There may be a case when some arrangement patterns of solder balls disposed at the most outside of the group of the solder balls exit in the range of some of the projecting portions 9a if the portions 9a are formed at the same intervals. In this case, it is not always necessary to form the projecting portions 9a equidistantly but at any intervals so as to prevent formation of the projecting portions 9a at the portions where the arrangement patterns exist. When the projecting portions 9a are not formed at such portions, the semiconductor devices can be supported without fail.

After semiconductor devices have been housed in trays according to the present invention, the trays are used by being piled up and fitting the side frames 7 of the undersurfaces of the upper trays on the outer walls of the side frames 4 of the upper surfaces of the lower trays.

Figure 7:
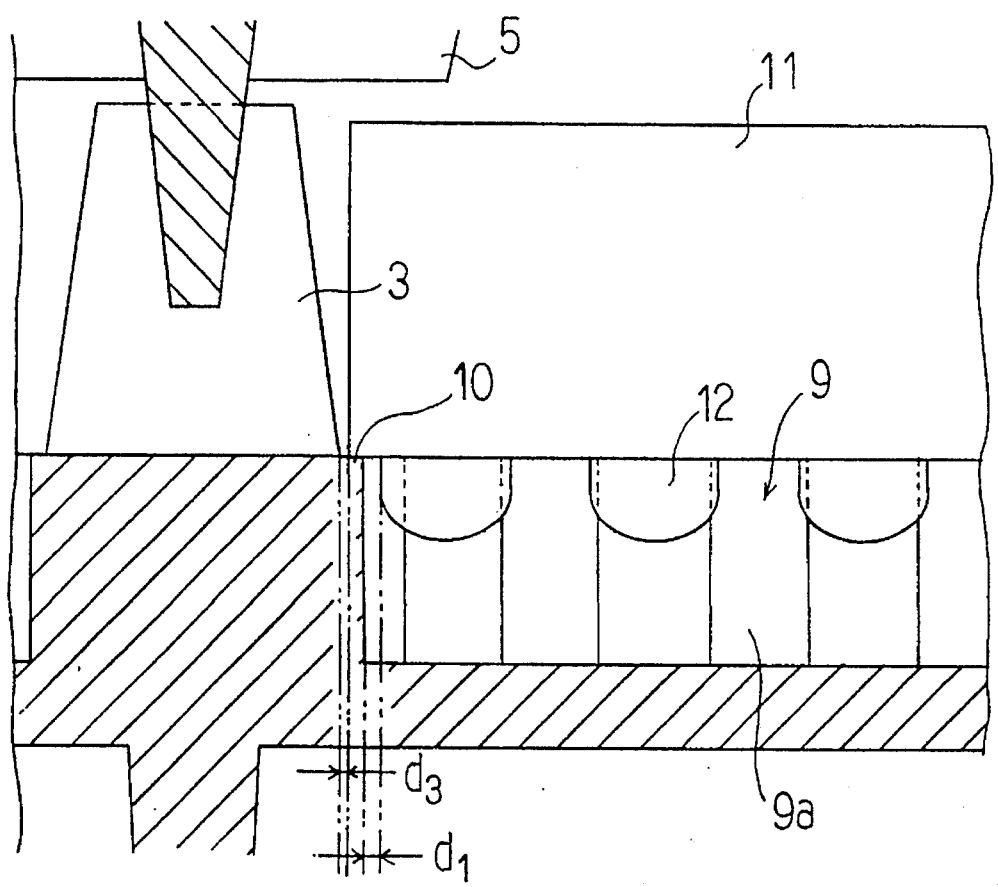
FIG. 7 is an enlarged longitudinal cross-sectional view of the main part of the tray of FIG. 1 in a state in which a semiconductor device is housed.

By doing so, as shown in FIG. 7, the downward extending ribs 5 of the undersurface of an upper tray are disposed over the outer lateral portions of semiconductor devices 11 housed in the pockets 2 in a lower tray and the upward extending ribs 3, whereby the downward extending ribs 5 restrict the vertical movements of the semiconductor devices 11. The upper surface of each semiconductor device 11 is spaced slightly from the downward extending ribs 5 of the upper tray so that vertical loads are not applied to the semiconductor devices 11.

The tray for semiconductor devices has the following technical advantages.

Since the outer peripheral edges of the undersurfaces of the semiconductor devices are supported by the supporting step portions in which the projecting portions formed in the inner walls of the depressions are inserted, the undersurface of each semiconductor device is supported well and the semiconductor device is housed in a pocket in a stable manner.

Since, therefore, the solder balls are housed in each depression without contacting the solder balls, a material of which an ordinary tray for semiconductor devices is made can be used as a material of the tray according to the present invention, thereby manufacturing the tray for semiconductor devices of a ball grid type according to the present invention at a low cost.

What is claimed is:

1. A tray for housing semiconductor devices of a ball grid type, each semiconductor device to be housed in the tray having a surface provided with a plurality of wiring solder balls, said surface of each of said semiconductor devices having peripheral edges, each of said wiring solder balls having a diameter, the tray comprising:

a tray surface;

a plurality of pockets formed in said tray surface, each pocket for receiving a semiconductor device therein and each of said pockets having corners and a bottom surface forming a depression;

a plurality of ribs, each rib having a root formed on each of said corners of each of said pockets for dividing said pockets from each other and each rib having a width which gradually increases toward said bottom surface of each of said pockets;

a plurality of supporting step portions, each supporting step portion formed between said roots of said ribs and said depression for supporting a corresponding peripheral edge of said surface of each of said semiconductor devices which are to be housed in the tray, each of said supporting step portions having an inner wall forming an inner wall of said depression; and a plurality of projections formed in each said supporting step portion and said projections defining a plurality of recesses therebetween for receiving peripheral ones of said wiring solder balls, each said recess having a substantially part-circular shape for receiving one said peripheral wiring solder ball therein.

2. A tray according to claim 1, wherein, when a semiconductor device is supported in one said pocket, a distance between said supporting step portion and said solder balls of said semiconductor device disposed closest to said supporting step portion is larger than a distance between said root of a corresponding one of said ribs and said outer peripheral edge of said surface of said semiconductor device.

3. A tray according to claim 1, wherein said recesses are spaced apart from each other by substantially equal distances along any said supporting step portion.

* * * * *